United States Patent [19]

Popovic et al.

[11] Patent Number: 4,689,291
[45] Date of Patent: Aug. 25, 1987

[54] PEDESTAL-TYPE MICROLENS FABRICATION PROCESS

[75] Inventors: Zoran D. Popovic, Mississauga, Canada; Robert A. Sprague, Saratoga; G. A. Neville Connell, Cupertino, both of Calif.

[73] Assignee: Xerox Corporation, Stamford, Conn.

[21] Appl. No.: 771,089

[22] Filed: Aug. 30, 1985

[51] Int. Cl.$^4$ ............................................. G03C 5/00
[52] U.S. Cl. .................................. 430/321; 430/323; 430/324; 430/330; 430/394; 350/417
[58] Field of Search ............... 430/321, 323, 324, 330, 430/394; 350/417

[56] References Cited

PUBLICATIONS

Ishihara et al., "A High Photosensitivity IL-CCD Image Sensor with Monolithic Resin Lens Array," Electron Device Meeting, 1983, pp. 497–500.

I. N. Ozerov, et al., "Shaping the Contours of Dies for Manufacturing Lens Arrays Having Spherical Elements," Soviet Journal of Optical Technology (USA), vol. 48, No. 1, Jan. 1981, pp. 49–50.

L. d'Auria, et al., "Photolithographic Fabrication of Thin Film Lenses," Optics Communications, vol. 5, No. 4, Jul. 1972, pp. 232–235.

Oikawa, M. et al., "Array of Distributed-Index Planar Micro-Lenses Prepared from Ion Exchange Technique," Japanese Journal of Applied Physics, vol. 20, No. 4, Apr. 1981, pp. L-296-298.

G. P. Shadurskii et al., "The Effect of Errors in the Fabrication of Lens Array Elements on the Effective Depth of Field," Soviet Journal of Optical Technology, vol. 41, No. 11, Nov. 1974, pp. 507–509.

G. S. Glukhovskiy, et al., "Evaluation of the Integrated Quality of Fine-Structure Lenslet Arrays," Soviet Journal of Optical Technology, vol. 40, No. 7, Jul. 1973, pp. 413–415.

R. Allen et al., "Deep U.V. Hardening of Positive Photoresist Patterns", Journal of the Electrochemical Society, vol. 129, Jun. 1982, pp. 1379–1381.

Primary Examiner—John E. Kittle
Assistant Examiner—Jose G. Dees

[57] ABSTRACT

Monolithic microlenses and microlens arrays are manufactured on opto-electronic devices and other substrates by using sharp edge pedestals to confine the lateral flow of a molten lens material. The lens material wets the upper surfaces of the pedestals, but the pedestal edges confine the flow, so the lens material conforms to the shape of the pedestal surface and assumes a semi-arcuate profile due to its surface tension. Spin coating and photolithographic patterning may be employed to form the pedestals and to deposit the lens material thereon. The lens material is melted after being deposited, so the pedestals advantageously are stabilized to prevent them from deforming at the temperature of the molten lens material.

10 Claims, 6 Drawing Figures

PEDESTAL-TYPE MICROLENS FABRICATION PROCESS

FIELD OF THE INVENTION

This invention relates to the fabrication of microlenses and, more particularly, to a process for monolithically manufacturing them as fully integrated components of optoelectronic devices and the like. Even more specifically, the present invention pertains to a reliable and repeatable process for applying existing semiconductor fabrication technology to the manufacture of microlenses and microlens arrays, thereby facilitating the production of integrated optics devices. In still further detail, the instant invention relates to the production of self-aligned microlens arrays, whereby the time and cost involved in establishing and maintaining a desired image and/or object plane optical alignment for such arrays is minimized.

CROSS REFERENCE

The microlens fabrication process of this invention is an alternative to the one described in a copending and commonly assigned U.S. patent application Zoran D. Popovic et al, which was filed Aug. 30, 1985 under Ser. No. 771,088 on a "Poorly Wettable Boundary-Type Microlens Fabrication Process". Accordingly, the processes have been disclosed against a common background and with reference to the same exemplary environment to highlight their distinguishing features.

BACKGROUND OF THE INVENTION

Integrated optics are critically important for the fast growing opto-electronics field. Solid state diode lasers often require beam shaping optics, and solid state photodetectors commonly utilize collection optics. These and other minaturized opto-electronic devices have created a demand for small, short focal length lenses (referred to herein as "microlenses"), so substantial effort and expense have been devoted to the development of microlenses and microlens arrays. Unfortunately, however, the process technology for producing such lenses has lagged behind the development of the LSI (large scale integrated) and the VLSI (very large scale integrated) semiconductor fabrication technology which is now being used to manufacture opto-electronic devices.

As a general rule, microlenses and microlens arrays are molded parts produced by replicating the contours of precisely machined dies. See, for example, I. N. Ozerov, et al. "Shaping the Contours of Dies for Manufacturing Lens Arrays Having Spherical Elements," *Soviet Journal of Optical Technology* (U.S.A.), Vol. 48, No. 1, January 1981, pp. 49-50. It is noted, however, that semiconductor fabrication technology has been proposed for the production of molds for replica-type production of stepped index zone plate lenses. See, L. d'Auria, et al., "Photolithographic Fabrication of Thin Film Lenses," *Optics Communications*, Vol. 5, No. 4, July 1972, pp. 232-5.

Replication is a suitable process for economically producing high quality, relatively uniform microlenses and microlens arrays, but the lenses still have to be mounted and optically aligned after being removed from the mold, so extreme care must be taken to ensure that they are properly aligned and firmly bonded or otherwise held in place when they are used for optoelectronics applications. Even then, the necessary optical alignment may be difficult to maintain over extended periods of time due to environmental factors, such a large temperature swings, which may cause differential thermal expansion of the lenses and the optoelectronic devices upon which they are mounted.

It also has been reported that planar arrays of distributed index microlenses have been produced. See, Oikawa, M. et al, "Array of Distributed-Index Planar Micro-Lenses Prepared from Ion Exchange Technique," *Japanese Journal of Applied Physics*, Vol. 20, No. 4, April 1981, pp. L296-8. Furthermore, criteria and procedures for evaluating microlenses and microlens arrays have been proposed. See, G. P. Shadurskii et al., "The Effect of Errors in the Fabrication of Lens Array Elements on the Effective Depth of Field," *Soviet Journal of Optical Technology*, Vol. 41, No. 11, November 1974, pp. 507-9, and G. S. Glukhovskiy, et al., "Evaluation of the Integrated Quality of Fine-Structure Lenslet Arrays," *Soviet Journal of Optical Technology*, Vol. 40, No. 7, July 1973, pp. 413-5. However, the foregoing references generally relate to the independent (i.e., non-monolithic) production and testing of microlenses and microlens array technology, so they do not purport to materially alleviate the bonding and alignment problems that are encountered when conventional microlenses are employed.

An integrated microlens structure and fabrication process was described by Y. Ishihara et al., "A High Photosensitivity IL-CCD Image Sensor with Monolithic Resin Lens Array," *International Electron Devices Meeting*, 1983, pp. 497-500. They reported on developing a process for producing strip lenses for areal CCD (charge coupled device) image sensor arrays through the use of more or less standard semiconductor fabrication technology. Briefly, according to their description of the process, they (1) deposited a second layer of resin on an annealed, thermally hardened, smooth base resin layer, (2) photolithographically patterned the second resin layer to form a stripe-like pattern, and (3) then heated the second layer resin sufficiently to cause it to flow, thereby transforming its stripe-like pattern into a series of semicylinderical rolls or convex lenses. The strip lenses are, therefore, integrated with the CCD arrays, thereby avoiding the bonding and alignment problems of discrete microlenses.

There is, however, an entirely separate issue that must be addressed with respect to controlling such an integrated lens fabrication process sufficiently to obtain repeatable results for the production of microlenses and microlens arrays to reasonably exacting optical specifications. In particular, one of the principal shortcomings of the abovedescribed process is that the flow of the second layer, lens forming resin is inadequately controlled to form microlenses having well defined geometries or to form geometrically uniform, high density arrays of spatially distributed, individually addressable microlenses. Instead, it appears from the description of the process that the thermal flow of the lens forming resin is virtually unbounded by anything except the thermal characteristics of the system, so the lenses tend to flow into the merge with one another, thereby making it extremely difficult, if not impossible, to predict their optical boundary characteristics with any substantial precision. While precise process control may not be required for the manufacture of some microlenses, the optical specifications for microlenses and microlens arrays usually are sufficiently exacting to require adequate process controls for ensuring that the optical characteristics of each microlens are independently determined.

SUMMARY OF THE INVENTION

In accordance with the present invention, microlenses and microlens arrays are produced by providing sharp edged pedestals for confining the flow of a molten lens forming material to the upper surfaces of the pedestals. The lens forming material wets the pedestals so it flows thereacross while in its liquid state, but the pedestal edges laterally confine the flow. Moreover, the area on each pedestal to which the flow is confined is so small that the internal pressure acting on the molten lens forming material due to its surface tension is much greater than any gravitational forces acting thereon, so the lens forming material confined on any given pedestal assumes an essentially constant radius curvilinear profile as determined by its volume and by the surface contour of the pedestal.

A planar or planarized opto-electronic device may have one or more microlenses monolithically fabricated thereon. Pedastals may be formed by photolithographically patterning a photoresist resin, and those pedestals may then be treated to increase their thermal stability. Thereafter, a second layer of photoresist resin may be overcoated on the pedestals and photolithographically patterned to confine it to the inner portions of the upper surfaces of the pedestals, and this second layer of resin may then be heated to its melting point, thereby causing it to flow, so that it forms precisely contoured microlenses when it cools and resolidifies.

BRIEF DESCRIPTION OF THE DRAWINGS

Still further objects and advantages of the present invention will become apparent when the following detailed description is read in conjunction with the attached drawings, in which.

DETAILED DESCRIPTION OF THE ILLUSTRATED EMBODIMENT

While the invention will be described in some detail hereinbelow with specific reference to a single illustrated embodiment, it is to be understood that there is no intent to limit it to that embodiment. On the contrary, the aim is to cover all modifications, alternatives and equivalents falling within the spirit and scope of the invention as defined by the appended claims.

Figure 1:
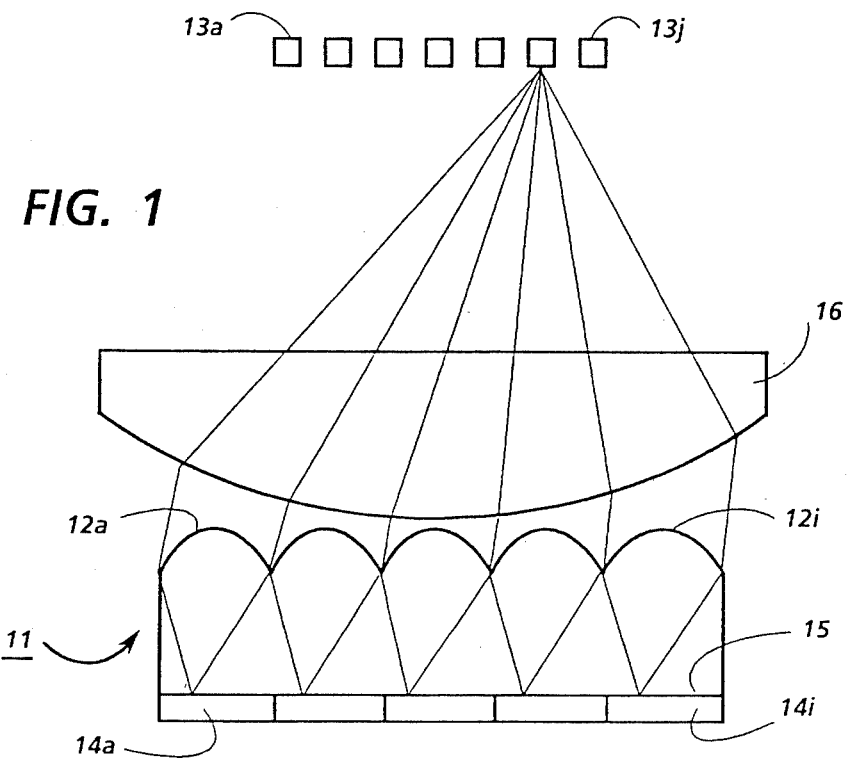
FIG. 1 is a schematic elevational view of a block oriented solid state optical memory having an integrated microlens array, such as may be produced in accordance with this invention.
Figure 3:
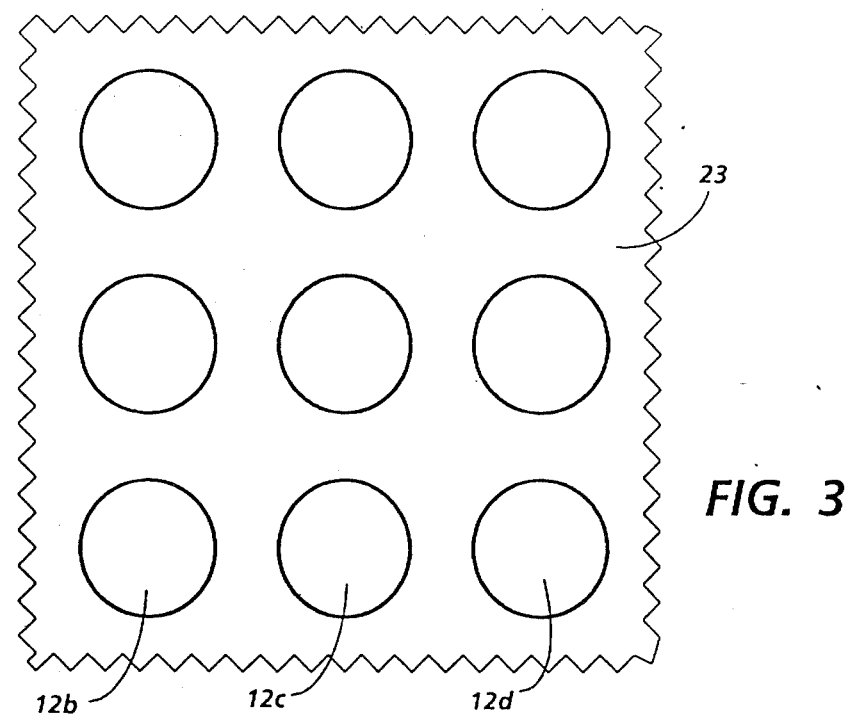
FIG. 3 is a fragmentary plan view of a microlens array manufactured in accordance with this invention.

Turning now to the drawings, and at this point especially to FIG. 1, there is a solid state optical memory 11 to provide an example of an opto-electronic device for which the integrated microlens fabrication process of the present invention is especially important. The memory 11 is described in substantial detail in a copending and commonly assigned U.S. patent application of R. A. Sprague et al., which was filed Dec. 4, 1984 under Ser. No. 678,145 for "High Density Block Oriented Solid State Optical Memories" (D/82066), so a brief review of it will suffice.

Multi-bit data "blocks" are selectively retrievable from the memory 11 on demand. To that end, the memory 11 comprises an array of microlenses 12a–12i for imaging an array of photoemitters 13a–13i in parallel onto an array of photodetectors 14a–14i via a data mask 15 which has a data dependent transmission profile. All of the photoemitters 13a–13i are imaged onto each of the photodetectors 14a–14i, so the transmission profile of the data mask 15 determines whether any given one of the photodetectors 14a–14i is or is not illuminated when only one of the photoemitters 13a–13i is selectively energized.

Correct optical alignment of the memory 11 ensures (i) that all bits of a selected data block are optically addressed in parallel by selectively energizing one and only one of the photoemitters 13a–13i, and (ii) that the bits of the optically addressed data block are then read out in parallel by the photodetectors 14a–14i, respectively, thereby converting them into a spatial sequence of high ("1") and low ("0") logic level digital electrical signals. A collimating lens 16 advantageously is included for collimating the light emitted by the photoemitters 13a–13i, whereby light received from any one of them passes through the apertures of all of the microlenses 12a–12i at substantially the same unique angle. Therefore, the microlens formed images of the photoemitter array 13a–13i not only have a substantially uniform magnification widthwise and depthwise of the photodetector array 14a–14i, but also may be appropriately optically aligned to be essentially centered on the photodetectors 14a–14i, respectively.

The data mask 15 typically is an optically opaque film or metallization which is suitably programmed (by means not shown) while data is being loaded onto it to have a spatially distributed pattern of small holes or apertures which pass therethrough at precisely predetermined locations. Thus, bits of one logic level, such as ("1's"), are represented by such apertures, while bits of the opposite ("0") logic level are represented by the opaque regions which remain. The data mask 15 may be coated on the photodetectors 14a–14i, although an intermediate planarizing layer (not shown) may be required to provide a planar substrate for the data mask 15.

Bits may be densely packed on the data mask 15 to provide a memory capacity of up to 16 Mbits or so for a memory 11 having external dimensions just slightly in excess of 1"×1"×1". Accordingly, it is important that the microlenses 12a–12i have essentially identical focal lengths, provide nearly diffraction limited imaging performance, and cause no significant lateral scattering of light reflected from the data mask 15. Those requirements, and the additional requirement that the microlenses 12a–12i must be carefully optically aligned with the data mask 15 and the photodetectors 14a–14i, respectively, are most readily satisfied by monolithically manufacturing the microlenses 12a–12i as a fully integrated overcoating on the data mask 15/photodetector 14a–14i assembly.

In accordance with the present invention, a process is provided for monolithically manufacturing microlenses and microlens arrays, such as the microlens array 12a–12i, to exacting optical specifications on opto-electronic devices, such as the data mask 15/photodetector 14a–14i assembly of the memory 11, or on other suitable substrates, such a quatz wafers. Existing semiconductor fabrication technology is employed to carry out the lens manufacturing process, so the risk of damaging an optoelectronic substrate while one or more microlenses are being formed thereon is essentially minimized.

Figure 2A:
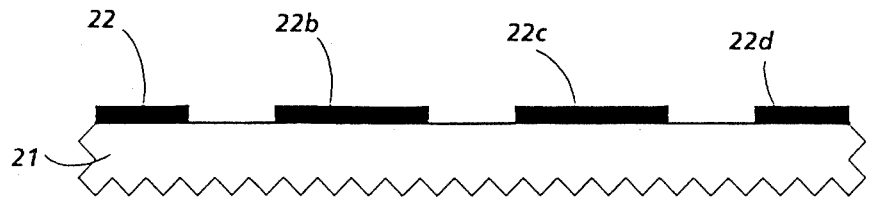
FIGS. 2a–2d are a step-by-step illustration of the microlens fabrication process of the present invention.
Figure 2B:
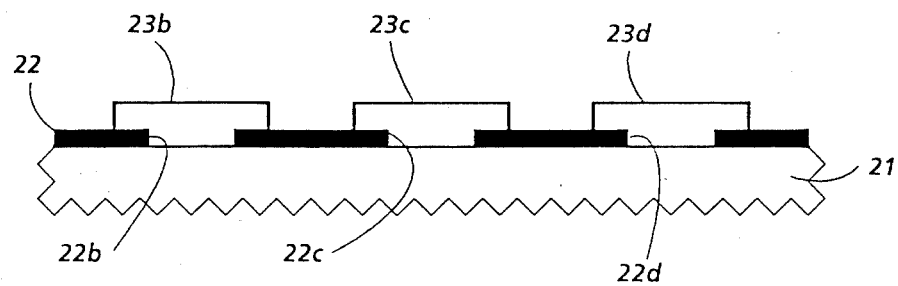

Referring to FIGS. 2a-2d, in keeping with this invention, the substrate for the microlenses 12a-12i is first coated with a polyimide layer 21 (shown only in part) of predetermined thickness or with a similar optically transparent material of approximately the same refractive index and thickness, thereby establishing a desired spatial relationship between the focal plane of the microlenses 12a-12i and their substrate. For example, the thickness of the coating 21 may be selected to cause the focal plane of the microlenses 12a-12i to substantially coincide with the plane of the data mask 15 (FIG. 1). Following the initial coating step a thin optically opaque metalization, such as an aluminum film 22, is deposited on the substrate 21, such as by vacuum evaporation, and the metalization is then photolithographically patterned, as shown in FIG. 2a, to form precisely dimensioned apertures 22a-22i (only a few of which can be seen) therethrough at predetermined locations. The apertures 22a-22i form stops for the microlenses 12a-12i, respectively. Thus, for example, they may be centered on the photodetectors 14a-14i (FIG. 1) and may be circularly configured to have diameters of approximately 15 microns.

Subsequently, sparp edged cylindrical pedestals 23a-23i (see FIG. 2b) having a diameter of roughly 30 microns are centered on the aperture stops 22a-22i, respectively. To that end, a nonvolac optical resin based positive photoresist, such as Shipley 1400-27 photoresist, is spun coated on the metallized substrate 21, typically at 4000 rpm for about 30 seconds. This resin layer is then photolitographically patterned to define the pedestals 23a-23i, and thereafter is hardbaked and deep U.V. hardened to ensure that the pedestals 23a-23i are thermally stable (i.e., non-deformable) to temperatures in excess of 180° C. See, R. Allen et al., "Deep U. V. Hardening of Positive Photoresist Patterns", *Journal of the Electrochemical Society*, Vol. 129, June 1982, pp. 1379-81. Advantageously, the height of the pedestals 23a-23i, which usually is on the order of one micron or so, is greater than the maximum radius of curvature of their upper edges for reasons that will be described hereinbelow.

Figure 2C:
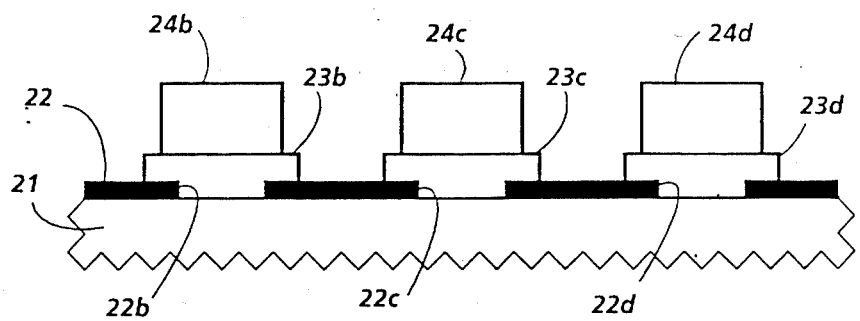

Next, as shown in FIG. 2c, a second layer of nonvolac optical resin based positive photoresist, such as Shipley TF-20 photoresist, is deposited by spin coating, suitably at 2000 rpm for 45 seconds to obtain a coating thickness or height of roughly 15 microns. Due to the relatively thick coating that is desired, the coating process preferably is carried out in two steps, so that the initial coating can be softbaked at about 90° C. for approximately 10 minutes before applying the second coating which, in turn, is softbaked for about 30 minutes. Upon completion of the coating process, the second photoresist layer is photolithographically patterned, so that all that remains of it are cylinders 24a-24i which are centered on the pedestals 23a-23i, respectively, and which have diameters of approximately 25 microns. It should, however, be understood that the geometrical positioning of the cylinders 24a-24i is not especially critical, provided that there is an adequate tolerance between their outer circumferences and the upper edges of the pedestals 23a-23i to prevent the formation of unwanted drip paths that would allow the second layer of resin to spill over the pedestal edges. Likewise, it should be noted that the configuration of the cylinders 24a-24i is merely a convenient mechanism for ensuring that they all contain nearly the same volume of material. As described hereinbelow, the volume of the second layer resin that resides on the pedestals 23a-23i determines the radii of the lenses 12a-12i, respectively, so equal volumes of material are provided to ensure that the lenses 12a-12i are essentially identical.

Figure 2D:
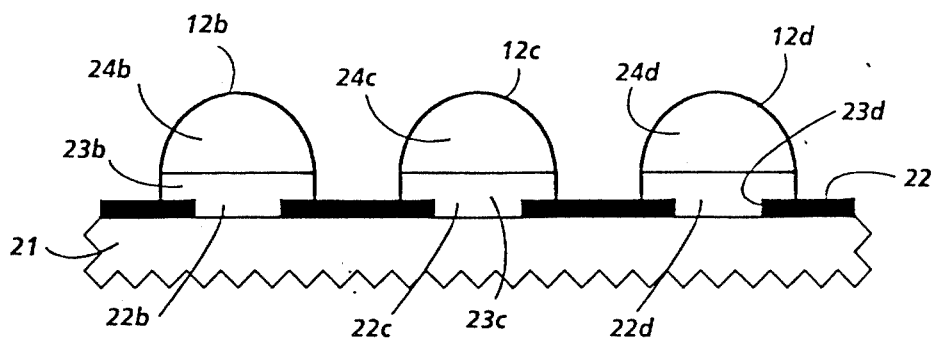

More particularly, to form the microlenses 12a-12i, the patterned second layer of resin (i.e., the cylinders 24a-24i) is flood exposed to near U. V. radiation, thereby reducing its melting temperature, and it is then heated to approximately 14° C. for about 15 minutes, thereby causing it to melt. As shown in FIG. 2d, the molten resin wets the hardened resin of the pedestals 23a-23i so it spreads laterally thereacross, but the sharp edges of the pedestals 23a-23i effectively confine the flow, thereby preventing the molten resin from spreading therebeyond. Typically, the volume of resin that is deposited on top of any one of the pedestals 23a-23i is limited to be no greater than approximately $2\pi r^3/3$, where r is the radius of the pedestals 23a-23i, but that is an adequate amount of material for forming hemispherical microlenses 12a-12i. Lesser amounts of material may be employed to produce microlenses having partial hemispherical configurations, so it will be useful to more generally define the volume of second layer resin/pedestal as an "equilibrium volume." That means that the volume of material is sufficiently small that it reaches a equilibrium state while being fully confined by the pedestal edges. See, J. F. Oliver et al., "Resistance to Spreading of Liquids by Sharp Edges," *Journal of Colloid and Interface Science*, Vol. 59, No. 3, May 1977, pp. 568-81. Effective confinement of the molten resin is ensured if the height of the pedestals 23a-23i is greater than maximum radius of curvature of their edges because that relationship satisfies all possible contact angles that the molten resin may exhibit with respect to the upper surfaces of the pedestals 23a-23i. Sharp edge drop offs from the upper surfaces of the pedestals 23a-23i are desired, but the degree of edge sharpness that is required is difficult to define with precision. Thus, the foregoing approximation is a useful guideline, especially because it is a conservative definition of the requirement.

The inherent surface tension of the second layer resin while it is in its molten state causes the microlenses 12a-12i to have substantially constant radii, provided that there is no significant gravitational deformation of the microlenses 12a-12i while they are cooling and resolidifying. The sharp edges of the pedestals 23a-23i limit the flow of the molten photoresist, thereby preventing the lens 12a-12i from merging into one another. Thus, it will be understood that non-hemispherical microlenses (not shown) may be fabricated in accordance with the teachings of this invention simply by modifying the shape of the pedestals 23a-23i. For example, (1) elongated strip-like pedestals could be provided for the fabrication of cylinderical lenses, and (2) elliptically shaped pedestals could be provided for the fabrication of elliptical lenses. Moreover, optically opaque materials, such as aluminum, may be utilized to form doughnut or ring shaped pedestals which surround, but do not cover, the aperture of the lens. Gravitational force may tend to deform the microlenses 12a-12i if they are too large, but no significant gravitational deformation occurs if the internal pressure of the molten photoresist is much greater than the gravitational pressure. In other words, gravitational forces can be ignored if $2t/r >> g\rho r$, where t and $\rho$ are the surface tension and the density, respectively, of the molten photoresist; r is the radius of the pedestals 23a–23i; and g is the gravitational force acting on the microlenses 12a–12i while they are still in their molten state.

CONCLUSION

In view of the foregoing, it will now be understood that the present invention provides a readily controllable microlens fabrication process which may be employed to monolithically manufacture microlenses and microlens arrays on opto-electronic devices and on other substrates. Furthermore, it will be evident that the microlens manufacturing process of this invention may be carried out using existing semiconductor fabrication technology.

What is claimed is:

1. A method for fabricating microlenses comprising the steps of depositing an optically opaque coating on a substrate;

forming an aperture through said coating, said aperture having predetermined lateral dimensions;

forming a pedestal on said coating, with said pedestal being substantially laterally centered on said aperture; said pedestal having an upper surface of predetermined area and shape, with said surface having an outer circumference bounded by a sharp edge drop off;

freely flowing a predetermined equilibrium volume of molten lens forming material laterally on said surface, said lens forming material being selected to wet said surface as it flows thereacross, and said volume being selected so that said flow is laterally confined circumferentially of said surface by said edge, thereby causing said molten lens forming material to substantially conform to the shape of said surface and to assume a semi-arcuate profile of substantially constant radius as determined by its volume; and solidifying said lens forming material to form a microlens having said shape and profile, together with an aperture defined by the aperture formed through said coating.

2. The method of claim 1 wherein
said substrate is an opto-electronic device.

3. The method of claim 1 wherein
said aperture is one of a plurality of substantially identical apertures which are formed through said coating at laterally distributed locations;

said pedestal is one of a plurality of substantially identical pedestals which are laterally centered on respective ones of said apertures;

substantially equal volumes of said molten lens forming material are provided for each of said pedestals to freely flow laterally on the upper surface thereof, said volumes each being substantially equal to said equilibrium volume;

whereby an array of laterally distributed microlenses having substantial identical shapes, profiles and apertures is formed.

4. The method of claim 1 wherein said pedestal is formed by the additional steps of overcoating said opaque coating with a photoresist of predetermined thickness, and photolithographically patterning said photoresist to form said pedestal.

5. The method of claim 4 further comprising the step of thermally stabilizing said pedestal sufficiently to prevent deformation thereof by said molten lens material.

6. The method of claim 4 wherein said lens forming material is an optical resin which is introduced by the additional steps of overcoating said pedestal with a coating of said optical resin, said optical resin coating having a predetermined thickness, photolithographically patterning said optical resin coating to reduce it to said predetermined equilibrium volume and to spatially confine said volume to the upper surface of said pedestal laterally inwardly from said edge, melting said volume of said optical resin to cause it to freely flow laterally on said surface, so that it substantially conforms to the shape thereof and assumes said profile.

7. The method of claim 6 wherein
said substrate is an opto-electronic device.

8. The method of claim 4 wherein
said aperture is one of a plurality of substantially identical apertures which are formed through said optically opaque coating at laterally distributed locations;

the photolithographic patterning of said photoresist forms a plurality of pedestals, each laterally centered on a respective one of said apertures, and all substantially identical to said pedestal;

substantially equal volumes of said molten lens forming material are provided for each of said pedestals to freely flow laterally on the upper surface thereof, said volumes each being substantially equal to said equilibrium volume;

whereby an array of laterally distributed microlenses having substantially identical shapes, profiles and apertures is formed.

9. The method of claim 8 wherein said lens forming material is an optical resin which is introduced by the additional steps of depositing an overcoating of said optical resin on said pedestals, said optical resin coating having a predetermined thickness, photolithographically patterning said optical resin to reduce it to a plurality of laterally distributed volumes, each supported on the upper surface of a respective one of said pedestals laterally inwardly of said edge, and each substantially equal to said equilibrium volume, and melting said volumes to cause each of them to flow laterally on the surface upon which it is supported, thereby causing said optical resin volumes to assume substantially identical shapes and profiles.

10. The method of claim 9 wherein
said substrate is an opto-electronic device,
whereby said microlens array is monolithically fabricated as an integrated component of said opto-electronic device.

* * * * *